(12) United States Patent
Chen et al.

(10) Patent No.: US 10,847,215 B2
(45) Date of Patent: Nov. 24, 2020

(54) BITCELL SHIFTING TECHNIQUE

(71) Applicant: Arm Limited, Cambridge (GB)

(72) Inventors: Andy Wangkun Chen, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/397,960

(22) Filed: Apr. 29, 2019

(65) Prior Publication Data

US 2020/0342937 A1  Oct. 29, 2020

(51) Int. Cl.
    *G11C 7/10*     (2006.01)
    *G11C 11/419*     (2006.01)
    *G11C 8/04*     (2006.01)

(52) U.S. Cl.
    CPC .......... *G11C 11/419* (2013.01); *G11C 7/1006* (2013.01); *G11C 7/1012* (2013.01); *G11C 8/04* (2013.01)

(58) Field of Classification Search
CPC ........ G11C 7/1012; G11C 7/1006; G11C 8/04
USPC ................................... 365/189.12, 154, 156
See application file for complete search history.

(56) References Cited

U.S. PATENT DOCUMENTS

| | | | | |
|---|---|---|---|---|
| 4,813,015 A | * | 3/1989 | Spak | ......................... G06F 7/78 365/189.12 |
| 8,189,408 B2 | * | 5/2012 | Gupta | .................. G11C 7/1006 365/189.12 |
| 8,339,838 B2 | * | 12/2012 | Ramaraju | ............. G11C 11/412 365/154 |
| 9,466,352 B2 | * | 10/2016 | Perner | ................... G11C 11/412 |
| 9,589,623 B2 | * | 3/2017 | Perner | .................... G11C 19/28 |
| 9,741,399 B2 | * | 8/2017 | Tiwari | ............... G11C 11/4091 |
| 2014/0247673 A1 | * | 9/2014 | Muralimanohar et al. .................. G11C 11/4094 365/189.02 |

* cited by examiner

*Primary Examiner* — Son L Mai
(74) *Attorney, Agent, or Firm* — Pramudji Law Group PLLC; Ari Pramudji

(57) ABSTRACT

Various implementations described herein are directed to circuitry having a bitcell array with bitcells arranged in columns and rows. The circuitry includes bitlines coupled to the columns of the bitcells and wordlines coupled to the rows of the bitcells. The bitcells are arranged in multiple groups of bitcells along corresponding wordlines in each row, and each group of bitcells in each row is configured to be shifted by at least one column with respect to another group of bitcells in a previous row.

20 Claims, 5 Drawing Sheets

300A

Bitcell for SRAM Array (8T Based)

300B

Bitcell for NVM Array (1st Row 6T+2T Based)

US 10,847,215 B2

BITCELL SHIFTING TECHNIQUE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional binary multipliers are typically the largest power consuming part of a circuit design. Generally, conventional binary multipliers are implemented with multiple logic gates, including, e.g., NAND2 gates, XOR gates, half-adder gates and full adder gates, which often demand a large area footprint on chip. These multiple different gates are typically used for partial product and sum, and these multiple different gates often cause routing congestion and use large amounts of dynamic power due to excessive toggling activity. As such, conventional binary multipliers typically consume substantial dynamic power and area.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for providing a weight-shifted array with time-multiplex sensing. For instance, the various schemes and techniques described herein may be adapted to provide for a low power compute-in-memory (CIM) device that operates as a novel multiplier with weight-shifted array and time-multiplex sensing that may be configured to reduce bitline levels from n^2 to n, improve sensing precision, and remove analog sensing to improve dynamic power.

Various implementations of providing weight-shifted bitcell array circuitry will now be described in greater detail herein with reference to FIGS. 1A-4.

Figure 1A:
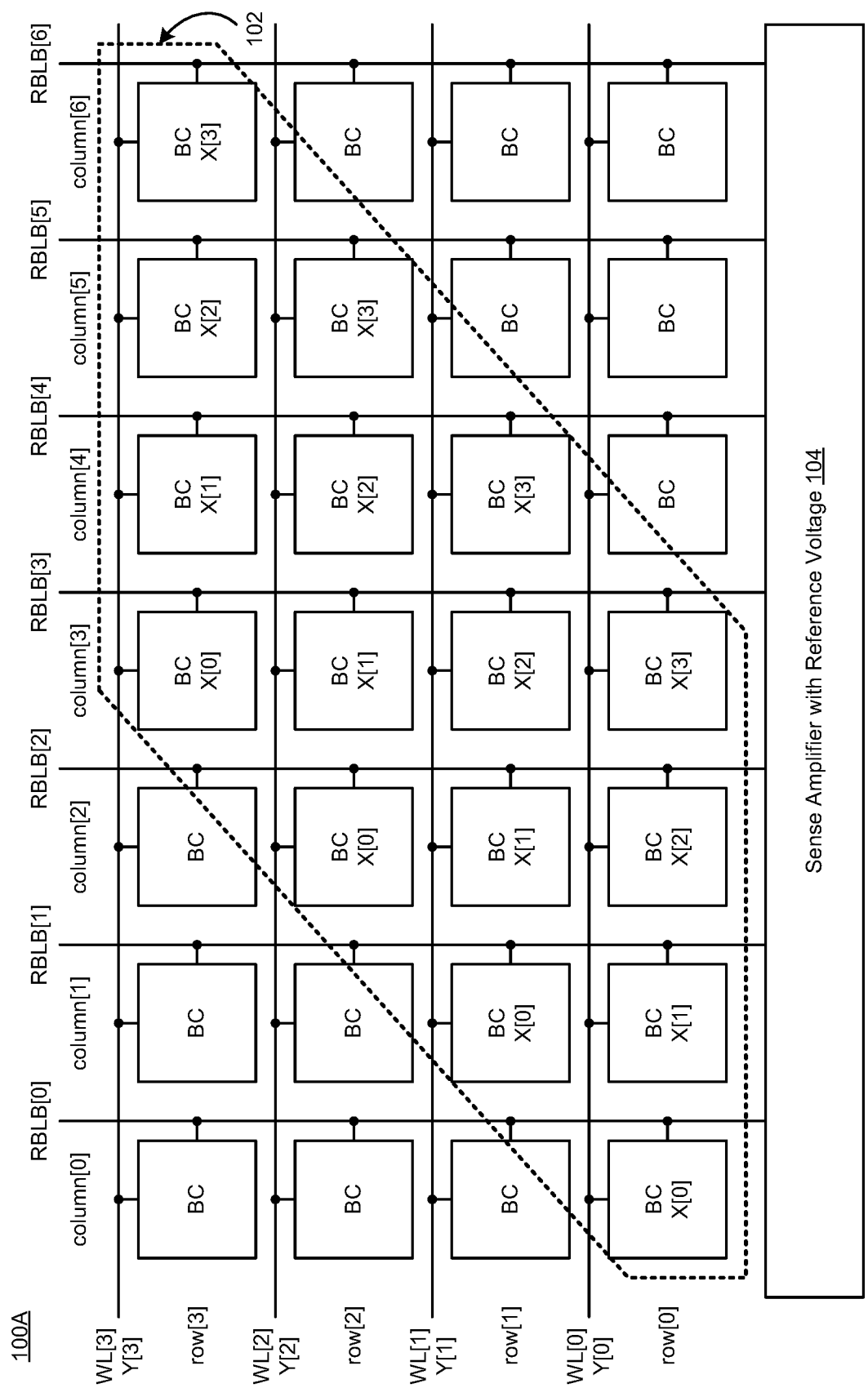
FIGS. 1A-1B illustrate a schematic diagram of memory circuitry in accordance with various implementations described herein.
Figure 1B:
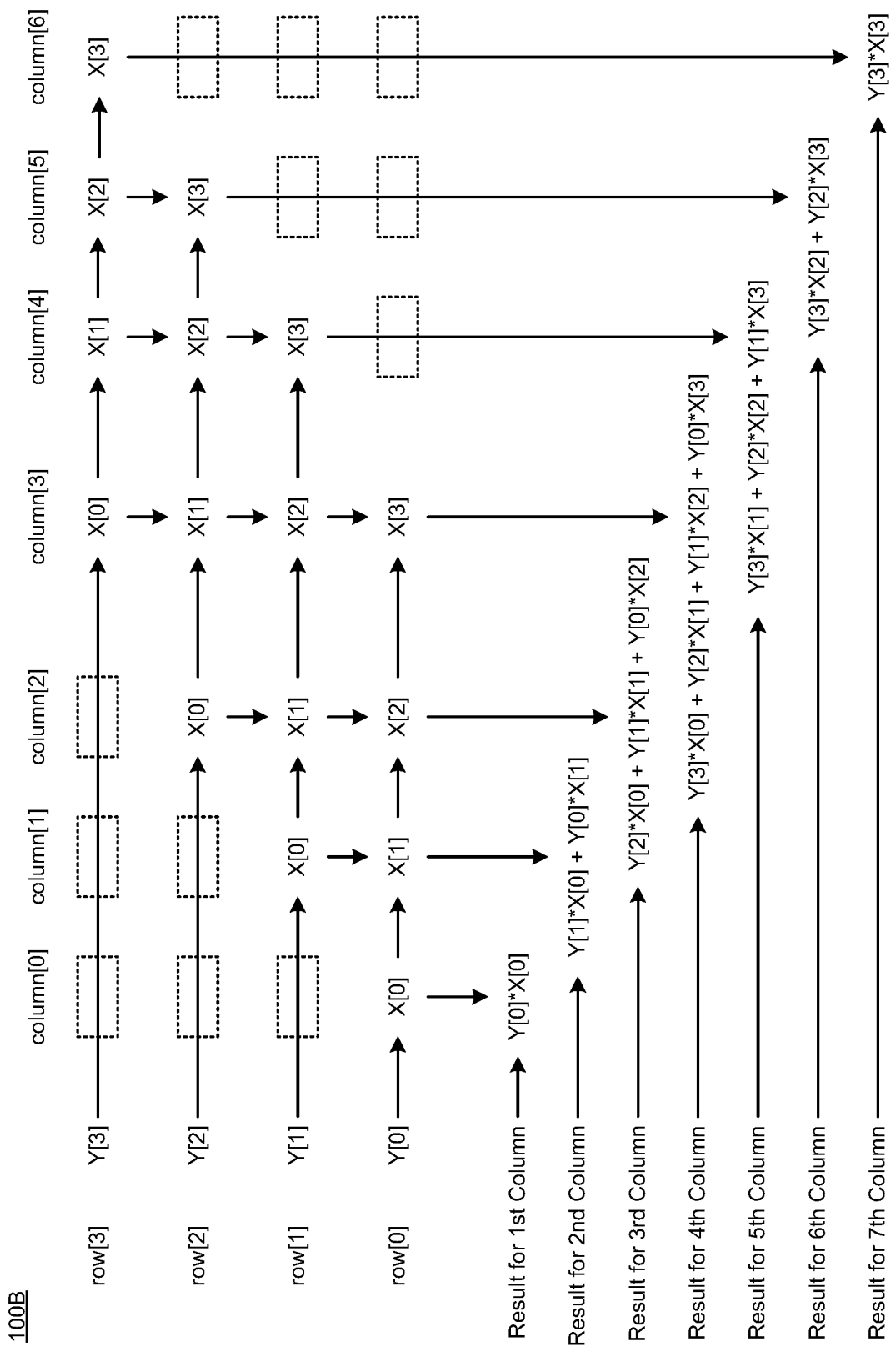

FIGS. 1A-1B illustrate various diagrams of memory circuitry 100A, 100B having an array of bitcells (BC) in accordance with implementations described herein. In particular, FIG. 1A illustrates a diagram of the memory circuitry 100A having a weight-shifted array, and FIG. 1B illustrates a diagram of the memory circuitry 100B adapted for computational operations with the weight-shifted array and time-multiplex sensing.

As shown in FIG. 1A, the memory circuitry 100A may include the array of bitcells (BC), such as, e.g., memory cells and related logic circuitry. As such, the memory circuitry 100A has a bitcell array with bitcells (BC) arranged in columns and rows. As described herein below, the bitcell array may be a static random access memory (SRAM) bitcell array, and each bitcell (BC) may be a multiple transistor (T) bitcell. For instance, the multiple transistor (T) bitcell may be an eight-transistor (8T) bitcell. Also, in some instances, the columns may include any number [M] of columns (e.g., with M=6: column[0], column[1], . . . , column[6]), and the rows may include any number [N] of rows (e.g., N=3: row[0], row[1], . . . , row[3]).

The memory circuitry 100A may include any number [M] of bitlines (e.g., with M=6: RBLB[0], RBLB[1], . . . , RBLB[6]) that are coupled to the columns of the bitcells (BC). In some instances, the bitlines may be referred to as read bitlines. As shown, the bitcells (BC) may be arranged in multiple groups of bitcells (e.g., some combination of one or more of X[0], X[1], X[2], X[3]) along corresponding bitlines (e.g., RBLB[0], RBLB[1], RBLB[2], RBLB[3], RBLB[4], RBLB[5], RBLB[6]) in each corresponding column (e.g., column[0], column[1], column[2], column[3], column[4], column[5], column[6]).

For instance, a first or initial column (column[0]) may include a single bit or bitcell (BC: X[0]), and a second column (column[1]) may include two bits or bitcells (BC: X[0] and BC: X[1]). Also, a third column (column[2]) may include three bits or bitcells (BC: X[0], BC: X[1], and BC: X[2]), and a fourth column (column[3]) may include four bits or bitcells (BC: X[0], BC: X[1], BC: X[2], and BC: X[3]). Also, a fifth column (column[4]) may include three bits or bitcells (BC: X[1], BC: X[2], and BC: X[3]), and a sixth column (column[5]) may include two bits or bitcells (BC: BC: X[2] and BC: X[3]). Also, a seventh or last column (column[6]) may include a single bit or bitcell (BC: X[3]).

The memory circuitry 100A may include any number [N] of wordlines (e.g., with N=3: WL[0], WL[1], . . . , WL[3]) that are coupled to the rows of the bitcells (BC). As shown, the bitcells (BC) may be arranged in multiple groups of bitcells (e.g., X[0], X[1], X[2], X[3]) along corresponding wordlines (e.g., WL[0], WL[1], WL[2], WL[3]) in each row (e.g., row[0], row[1], row[2], row[3]). In some instances, each group of bitcells (e.g., X[0], X[1], X[2], X[3]) may include multiple sequential bitcells in each row (e.g., row[0], row[1], row[2], row[3]). Also, as shown, the wordlines (e.g., WL[0], WL[1], WL[2], WL[3]) may have a corresponding Y-value assigned thereto (e.g., Y[0], Y[1], Y[2], Y[3]). Further, each group of bitcells (e.g., X[0], X[1], X[2], X[3]) in each row (e.g., row[0], row[1], row[2], row[3]) may be configured to be shifted by at least one column with respect to another group of bitcells in a previous row. For instance, the second column (e.g., column[1]) is shifted by one column to the right of the first column (e.g., column[0]), and so on across the remaining columns.

In various implementations, the multiple sequential bitcells in each row may include any number of bitcells. For instance, as shown in FIG. 1A, each group of bitcells (e.g., X[0], X[1], X[2], X[3]) may be 4. However, in various other instances, each group of bitcells may be some other number of bitcells. Also, the multiplier may take any form including, e.g., 4×4 (as shown in FIG. 1A), or 2×2, 2×3, 2×4, 3×3, 3×5, or any other combination.

In some implementations, the bitcell array 100A may refer to a weight-shifted bitcell array 102 that provides for an increase in magnitude of a subsequent row when shifting to a subsequent column, and also, weight of the subsequent row increases when shifting to the subsequent column. As shown, the columns (e.g., column[0], column[1], . . . , column[6]) may include an initial column (e.g., column[0]), a last column (e.g., column[6]), and one or more additional columns (e.g., column[1], column[2], column[3], column[4], column[5]) disposed between the initial column (e.g., column[0]) and the last column (e.g., column[6]). Also, as shown, the rows (e.g., row[0], row[1], . . . , row[3]) may include an initial row (e.g., row[0]), a last row (e.g., row[3]), and one or more additional rows (e.g., row[1], row[2]) that are disposed between the initial row (e.g., row[0]) and the last row (e.g., row[3]).

The memory circuitry 100A may include a sense amplifier 104 that is coupled to the bitcells (BC) in the bitcell array via the bitlines (e.g., RBLB[0], RBLB[1], . . . , RBLB[6]). In some instances, the sense amplifier 104 may be a digital sense amplifier with a reference voltage. As described herein below in reference to FIG. 1B, the sense amplifier 104 may be configured to use time-multiplex sensing to perform computational operations so as to reduce dynamic power consumption of the bitcell array. In some implementations, the time-multiplex sensing may refer to sensing a summation of values of bitcells (BC) along a column at different time intervals. Also, the sense amplifier may operate with a reference voltage at 0.5*Vdd, and a dummy bitline (DBL) having different pull-down strengths may be used to sample at different time steps. The memory circuitry 100A may also include a final carry-look-ahead adder that is optimized at different sense amplifier sample steps.

The implementation shown in FIG. 1A provides for a 4×4 binary multiplier (i.e., a digital 4-bit by 4-bit multiplier). However, various similar concepts may be expanded to any combination of multipliers along with different types of bitcells, such as, e.g., non-volatile memory (NVM) bitcells as described herein in reference to FIG. 2. In various other instances, the multiplier may be of any relevant size, such as, e.g., 2×2, 2×3, 2×5, 3×3, 3×4, 4×4, 5×5, . . . , 8×8, . . . , etc.

In some implementations, the memory circuitry 100A includes the array of bitcells (or bitcell array) as a memory structure, and each bitcell (BC) in the bitcell array may also be referred to as a memory cell. Each bitcell (BC) may be configured to store at least one data bit value (e.g., a data value associated with logical '0' or '1'). Each row of bitcells in the bitcell array may include any number of bitcells arranged in various configurations, such as, e.g., a two-dimensional (2D) memory array having columns and rows of multiple bitcells arranged in a 2D grid pattern. Each bitcell (BC) may be implemented with random access memory (RAM) circuitry, or some other type of volatile memory. For instance, each bitcell (BC) may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, the high-density SRAM bitcells that are implemented with minimally sized transistors may limit Vmin of a design. However, in FinFET technology, device sizing quantization remains a challenge for compact 6T SRAM bitcells with minimum-size transistors. As such, in some implementations, careful optimization of design memory assist circuits may be used to deliver low power memory operation. In addition, each bitcell (BC) in the bitcell array may be accessed with a selected wordline WL and at least one read bitline RBLB.

Generally, static RAM bitcells may include 6T bitcells, which may have access ports controlled by wordlines (WLs). In various implementations, static RAM bitcells may be implemented with a 5T bitcell, 4T 2R bitcell, or various other types of CMOS SRAM cells, such as, e.g., 8T, 10T or more transistors per bit. Also, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in, e.g., a left-half array and a right-half array.

The memory circuitry 100A including each bitcell in the array may be implemented as an integrated circuit (IC) with various types of memory circuitry, such as, e.g., random access memory (RAM), and/or any other types of memory, including any type of volatile memory and non-volatile memory. The memory circuitry 100A may be implemented as an IC with single and/or dual rail memory architectures. The memory circuitry 100A may also be integrated with computing circuitry and related components on a single chip. Further, the memory circuitry 100A may be implemented in an embedded system for various types of electronic, mobile, Internet-of-Things (IoT) and/or biometric applications.

As shown in FIG. 1B, the memory circuitry 100A may be configured for various computational operations with the weight-shifted array and time-multiplex sensing. Also, the sense amplifier 104 may be adapted to perform binary multiplication by performing one or more of the following operations. For instance, the sense amplifier 104 may generate a first or an initial summation result for the first or initial column (e.g., column[0]) by generating a multiplicative product (e.g., Y[0]*X[0]) of a wordline signal value (e.g., Y[0]) of the initial row (e.g., row[0]) with a bitcell data value (e.g., X[0]) of a corresponding bitcell in the initial column (e.g., column[0]).

(1) result for first column[0]=Y[0]*X[0]

Also, the sense amplifier 104 may generate additional summation results for each column (e.g., result for second column through sixth column) of the one or more additional columns (e.g., column[1], . . . , column[6]) by generating multiplicative products of wordline signal values (e.g., Y[0], Y[1], Y[2], Y[3]) of the one or more rows (e.g., row[0], row[1], row[2], row[3]) with corresponding bitcell data values (e.g., X[0], X[1], X[2], X[3]) of corresponding bitcells in the one or more additional columns (e.g., column[1], . . . , column[6]).

In reference to additional summation results, the sense amplifier 104 may generate a second summation result for the second column (column[1]) by generating a multiplicative product (e.g., Y[1]*X[0]+Y[0]*X[1]) of wordline signal values (Y[1], Y[0]) of one more rows (row[0], row[1]) with bitcell data values (X[1], X[0]) of corresponding bitcells in the second column (column[1]).

(2) result for second column[1]=Y[1]*X[0]+Y[0]*X[1]

Also, the sense amplifier 104 may generate a third summation result for the third column (column[2]) by generating a multiplicative product (e.g., Y[2]*X[0]+Y[1]*X[1]+Y[0]*X[2]) of wordline signal values (Y[2], Y[1], Y[0]) of the one or more rows (row[0], row[1], row[2]) with bitcell data values (X[2], X[1], X[0]) of corresponding bitcells in the third column (column[2]).

(3) result for third column[2]=Y[2]*X[0]+Y[1]*X[1]+Y[0]*X[2]

Also, the sense amplifier 104 may generate a fourth summation result for the fourth column (column[3]) by generating a multiplicative product (e.g., Y[3]*X[0]+Y[2]*X[1]+Y[1]*X[2]+Y[0]*X[3]) of wordline signal values (Y[3], Y[2], Y[1], Y[0]) of the one or more rows (row[0], row[1], row[2], row[3]) with bitcell data values (X[3], X[2], X[1], X[0]) of corresponding bitcells in the fourth column (column[3]).

(4) result for fourth column[3]=Y[3]*X[0]+Y[2]*X[1]+Y[1]*X[2]+Y[0]*X[3]

Also, the sense amplifier 104 may generate a fifth summation result for the fifth column (column[4]) by generating a multiplicative product (e.g., Y[3]*X[1]+Y[2]*X[2]+Y[1]*X[3]) of wordline signal values (Y[3], Y[2], Y[1]) of the one or more rows (row[1], row[2], row[3]) with bitcell data values (X[3], X[2], X[1]) of corresponding bitcells in the fifth column (column[4]).

(5) result for fifth column[4]=Y[3]*X[1]+Y[2]*X[2]+Y[1]*X[3]

Also, the sense amplifier 104 may generate a sixth summation result for the sixth column (column[5]) by generating a multiplicative product (e.g., Y[3]*X[2]+Y[2]*X[3]) of wordline signal values (Y[3], Y[2]) of the one or more rows (row[2], row[3]) with bitcell data values (X[3], X[2]) of corresponding bitcells in the sixth column (column[5]).

(6) result for sixth column[5]=Y[3]*X[2]+Y[2]*X[3]

Further, the sense amplifier 104 may generate a seventh or a last summation result for the seventh or last column (column[6]) by generating a multiplicative product (e.g., Y[3]*X[3]) of a wordline signal value (Y[3]) of the last row (row[3]) with a bitcell data value (X[3]) of a corresponding bitcell in the last column (column[6]).

(7) result for seventh column[6]=Y[3]*X[3]

In some implementations, the wordline signal values (e.g., Y[0], Y[1], Y[2], Y[3]) of each row (e.g., row[0], row[1], row[2], row[3]) may represent a first data bit value of logic 1 or a second data bit value of logic 0. Also, in other implementations, each bitcell (BC: X[0], X[1], X[2], X[3]) in the bitcell array may be adapted to store a first data bit value of logic 1 or a second data bit value of logic 0.

Figure 2:
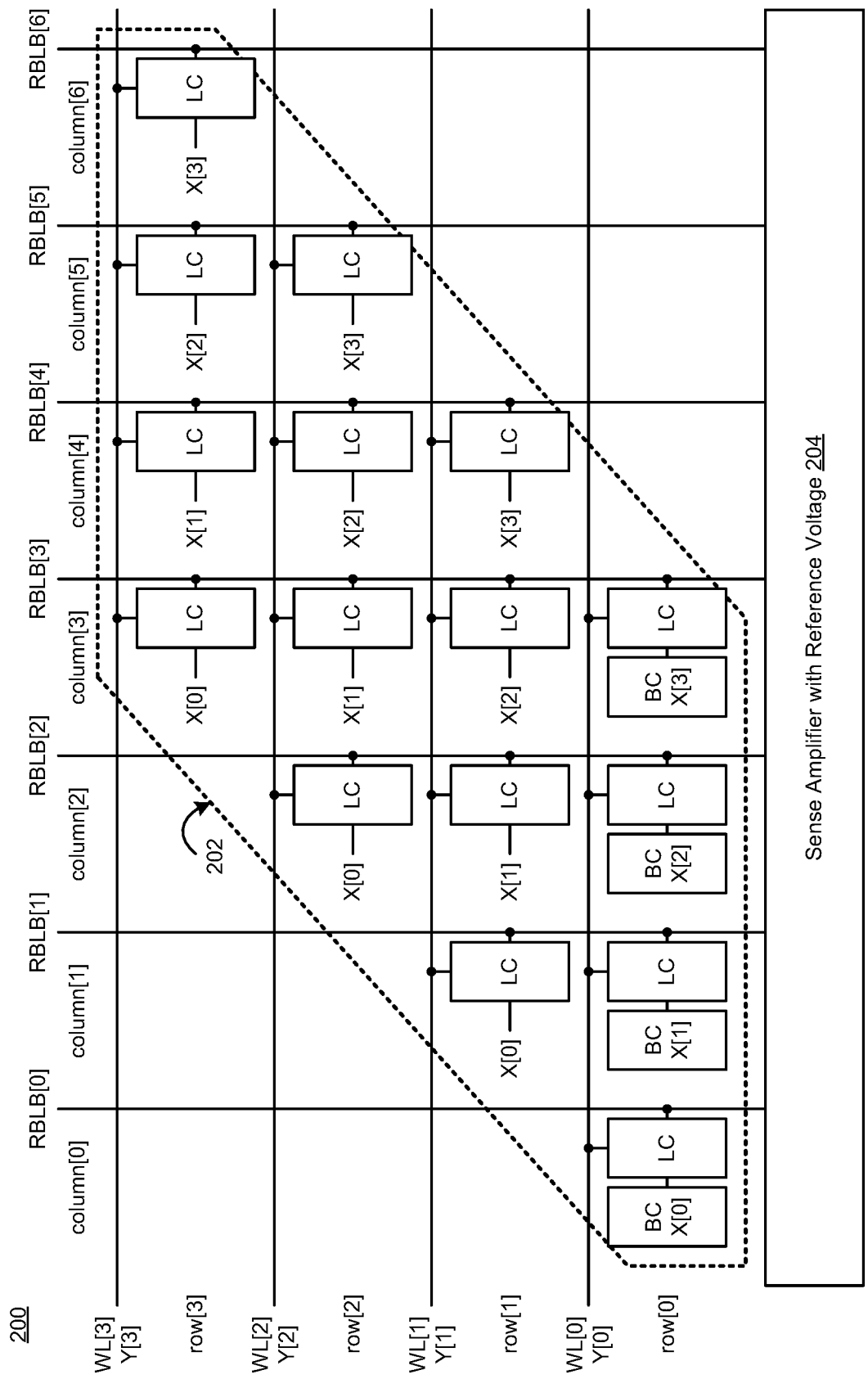
FIG. 2 illustrates a schematic diagram of other memory circuitry in accordance with various implementations described herein.

FIG. 2 illustrates a schematic diagram of other memory circuitry 200 having an array of bitcells (BC) and/or logic circuitry (LC) in accordance with implementations described herein. In some instances, FIG. 2 shows the memory circuitry 200 as a weight-shifted array having bitcells BC and/or logic circuitry (LC) adapted for computational operations with the weight-shifted array and time-multiplex sensing.

As shown in FIG. 2, the memory circuitry 200 may include the array of bitcells (BC) and/or logic circuitry (LC). I.e., the memory circuitry 200 has a bitcell array with bitcells (BC) and/or logic circuitry (LC) arranged in columns and rows. In some implementations, the bitcell array may be a non-volatile memory (NVM) bitcell array, and each bitcell (BC) may be a multiple transistor (T) bitcell with logic circuitry (LC). For instance, the multi-transistor (T) bitcell may be a six-transistor (6T) bitcell with a multi-transistor (2T) logic circuitry (LC).

In some instances, the columns may include any number [M] of columns (e.g., with M=6: column[0], column[1], . . . , column[6]), and the rows may include any number [N] of rows (e.g., N=3: row[0], row[1], . . . , row[3]). In some instances, the bitcell array 200 may refer to a weight-shifted bitcell array 202 that provides for an increase in magnitude of a subsequent row when shifting to a subsequent column, and also, weight of the subsequent row increases when shifting to the subsequent column.

The memory circuitry 200 may include a number [M] of bitlines (e.g., with M=6: RBLB[0], RBLB[1], . . . , RBLB[6]) that are coupled to the bitcells in the array corresponding to the columns. In some instances, the bitlines may be referred to as read bitlines. As shown, the bitcells (BC, LC) may be arranged in multiple groups of bitcells (e.g., some combination of one or more X[0], X[1], X[2], X[3] with LC) along corresponding bitlines (e.g., RBLB[0], RBLB[1], RBLB[2], RBLB[3], RBLB[4], RBLB[5], RBLB[6]) in each corresponding column (e.g., column[0], column[1], column[2], column[3], column[4], column[5], column[6]).

For instance, a first or initial column (column[0]) may include a single bit or bitcell (BC: X[0] with LC), and a second column (column[1]) may include two bits or bitcells (BC: X[0] input to LC and BC: X[1] with LC). Also, a third column (column[2]) may include three bits or bitcells (BC: X[0] input to LC, BC: X[1] input to LC, and BC: X[2] with LC), and a fourth column (column[3]) may include four bits or bitcells (BC: X[0] input to LC, BC: X[1] input to LC, BC: X[2] input to LC, and BC: X[3] with LC). Also, a fifth column (column[4]) may include three bits or bitcells (BC: X[1] input to LC, BC: X[2] input to LC, and BC: X[3] input to LC), and a sixth column (column[5]) may include two bits or bitcells (BC: BC: X[2] input to LC and BC: X[3] input to LC). Also, a seventh or last column (column[6]) may include a single bit or bitcell (BC: X[3] input to LC).

The memory circuitry 200 may include a number [N] of wordlines (e.g., with N=3: WL[0], WL[1], . . . , WL[3]) that are coupled to the bitcells in the array corresponding to the rows. As shown, the bitcells (BC, LC) may include a single group of first bitcells (e.g., X[0]+LC, X[1]+LC, X[2]+LC, X[3]+LC) along an initial wordline (e.g., WL[0]) in an initial row (e.g., row[0]). Also, other bitcells (LC) may include multiple groups of second bitcells (LC) along subsequent wordlines (e.g., WL[1], WL[2], WL[3]) in each subsequent row (e.g., row[1], row[2], row[3]) after the initial row (e.g., row[0]). Also, as shown, the wordlines (e.g., WL[0], WL[1], WL[2], WL[3]) may have a corresponding Y-value assigned thereto (e.g., Y[0], Y[1], Y[2], Y[3]). Further, each group of bitcells (e.g., X[0], X[1], X[2], X[3]) in each row (e.g., row[0], row[1], row[2], row[3]) may be configured to be shifted by at least one column with respect to another group of bitcells in a previous row. For instance, the multiple groups of second bitcells (LC) may be configured to be shifted by at least one column with respect to the single group of first bitcells (e.g., X[0]+LC, X[1]+LC, X[2]+LC, X[3]+LC) and each group of second bitcells (LC) in a previous row.

In various implementations, the multiple sequential bitcells in each row may include any multiple of two sequential bitcells. For instance, as shown in FIG. 2, the single group of first sequential bitcells (e.g., X[0]+LC, X[1]+LC, X[2]+LC, X[3]+LC) may be 4, which is a multiple of 2. Also, as shown in FIG. 2, the multiple groups of second sequential bitcells (e.g., X[0] input to LC, X[1] input to LC, X[2] input to LC, X[3] input to LC) may be 4, which is also multiple of 2. However, in various other instances, each group of sequential bitcells may be some other multiple of two (2), including at least one of 2, 4, 8, 16, 32, 64, 128, 256, 512, and 1024. Also, the first bitcells (e.g., X[0]+LC, X[1]+LC, X[2]+LC, X[3]+LC) may include a six transistor (6T) bitcell along with a two transistor logic circuit (LC). Further, the second bitcells (LC) may include the two transistor (2T) logic circuit (LC).

As shown in FIG. 2, the columns include an initial column (e.g., column[0]), a last column (e.g., column [6]), and one or more additional columns (e.g., column[1], column [2], . . . , column[5]) disposed between the initial column (e.g., column[0]) and the last column (e.g., column[6]). Also, as shown, the rows include the initial row (e.g., row[0]), a last row (e.g., row[3]), and one or more additional rows (e.g., row[1], row[2]) disposed between the initial row (e.g., row[0]) and the last row (e.g., row[3]).

The memory circuitry 200 may include a sense amplifier 204 that is coupled to the bitcells (BC and/or LC) in the bitcell array via the bitlines (e.g., RBLB[0], RBLB[1], RBLB[2], RBLB[3], RBLB[4], RBLB[5], RBLB[6]). In some instances, the sense amplifier 204 may be a digital sense amplifier with a reference voltage. Also, the sense amplifier 204 may use time-multiplex sensing to reduce dynamic power consumption of the bitcell array, and time-multiplex sensing may refer to sensing a summation of values of bitcells along a column at different time intervals.

In some implementations, as described similarly above in reference to FIG. 1B, the sense amplifier 204 may be configured to perform computations, such as, e.g., binary multiplication, by performing one or more of the following operations. For instance, the sense amplifier 204 may be configured to generate an initial summation result for the initial column (column[0]) by generating a multiplicative product of a wordline signal value (WL[0]: Y[0]) of the initial row row[0] with a bitcell data value (X[0]) of a corresponding bitcell in the initial column (column[0]). Also, the sense amplifier 204 may be configured to generate additional summation results for each column of the one or more additional columns (e.g., column[1], . . . , column[5]) by generating multiplicative products of wordline signal values (e.g., WL[1], WL[2]) of the one or more additional rows (e.g., row[0], . . . , row[3]) with corresponding bitcell data values (e.g., some combination of X[0], X[1], X[2], X[3]) of corresponding bitcells in the one or more additional columns (e.g., column[1], . . . , column[5]). Further, the sense amplifier 204 may be configured to generate a last summation result for the last column (e.g., column[6]) by generating a multiplicative product of a wordline signal value (e.g., WL[3]) of the last row (e.g., row[3]) with a bitcell data value (e.g., X[3]) of a corresponding bitcell in the last column (e.g., column[6]).

In some implementations, the wordline signal values (e.g., Y[0], Y[1], Y[2], Y[3]) of each row (e.g., row[0], row[1], row[2], row[3]) may represent a first data bit value of logic 1 or a second data bit value of logic 0. Also, in other implementations, each bitcell (BC: X[0], X[1], X[2], X[3]) in the bitcell array may be adapted to store a first data bit value of logic 1 or a second data bit value of logic 0.

Figure 3A:
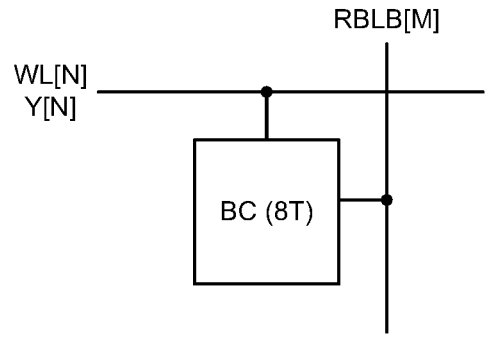
FIGS. 3A-3B illustrate a schematic diagram of bitcell circuitry in accordance with various implementations described herein.
Figure 3B:
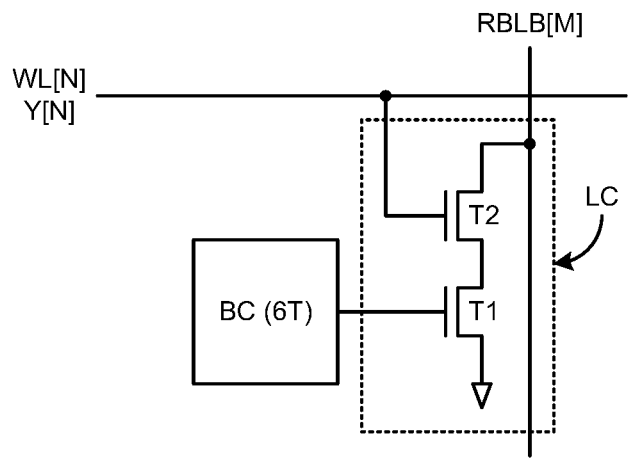

FIGS. 3A-3B illustrate a schematic diagram of bitcell circuitry in accordance with various implementations described herein. In particular, FIG. 3A shows a diagram of bitcell circuitry 300A having a multi-transistor bitcell (e.g., an 8T bitcell), and FIG. 3B shows a diagram of bitcell circuitry 300B having a multi-transistor bitcell (e.g., a 6T bitcell) along with logic circuitry (LC) having multiple transistors (e.g., 2T).

As shown in FIG. 3A, the bitcell circuitry 300A may comprise a multiple transistor bitcell (BC), such as, e.g., an eight-transistor (8T) bitcell. The bitcell (BC) may be coupled to a wordline (WL[N]) having a wordline signal value (Y[N]) associated therewith, and the bitcell (BC) may also to coupled to a bitline (RBLB[M]). In some instances, when selected, the wordline (WL[N]) and the bitline (RBLB [M]) provide access to the bitcell (BC). Also, the bitcell (BC) may be part of the SRAM array as shown in FIG. 1A. For instance, as shown in FIG. 1A, each row of bitcells (row[0], row[1], row[2], row[3]) may include the 8T bitcell (BC).

As shown in FIG. 3B, the bitcell circuitry 300B may comprise a multiple transistor bitcell (BC), such as, e.g., a six-transistor (6T) bitcell, along with the logic circuitry (LC). The logic circuitry (LC) may comprise multiple transistors (e.g., 2T) that are coupled between the bitcell (BC) and the signal lines (WL[N], RBLB[M]). For instance, as shown, the bitcell (BC) may be coupled to a gate of a first transistor (T1), and the first transistor (T1) may be coupled between a second transistor (T2) and ground. Also, as shown, the wordline (WL[N]) may be coupled to a gate of the second transistor (T2), and the second transistor (T2) may be coupled between the bitline (RBLB[M]) and the first transistor (T1). The wordline (WL[N]) has a wordline signal value (Y[N]) associated therewith. In some instances, when selected, the wordline (WL[N]) and the bitline (RBLB[M]) provide access to the bitcell (BC). Also, the bitcell (BC) may be part of the NVM array as shown in FIG. 2. For instance, as shown in FIG. 2, the first row of bitcells (row[0]) may include the 6T bitcell (BC) coupled to the logic circuitry (LC), and the remaining rows of bitcells (row[1], row[2], row[3]) may include only the logic circuitry (LC) having inputs associated with X[0], X[1], X[2], X[3].

Figure 4:
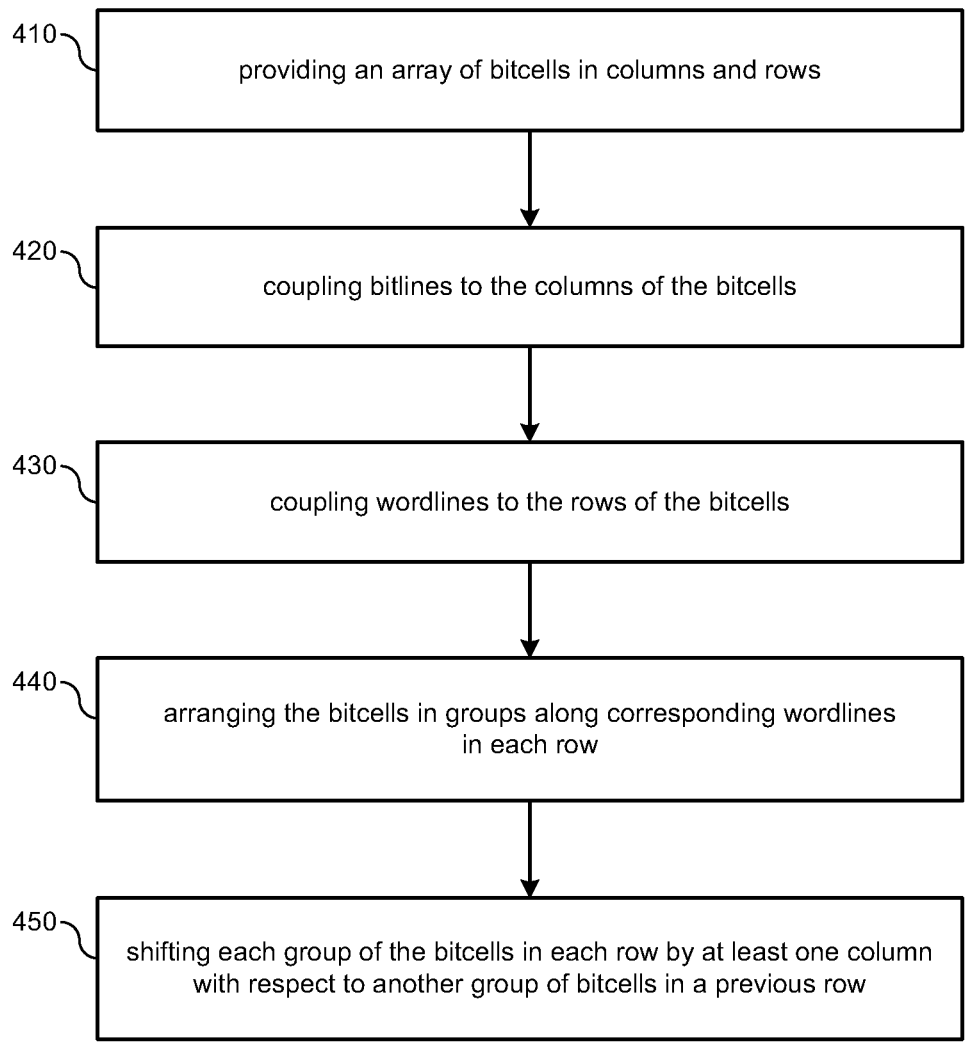
FIG. 4 illustrates a process diagram of a method for providing a weight-shifted array with time-multiplex sensing in accordance with implementations described herein.

FIG. 4 illustrates a diagram of a method 400 for providing a weight-shifted array with time-multiplex sensing in accordance with implementations described herein.

It should be understood that even though method 400 indicates a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1A-3B. Also, if implemented in software, method 400 may be implemented as a program and/or software instruction process configured for providing a weight-shifted array with time-multiplex sensing, as described herein above. Further, if implemented in software, instructions related to implementing the method 400 may be stored in memory and/or a database. For instance, a computer or various other types of computing devices having at least one processor and memory may be configured to perform method 400.

As described in reference to FIG. 4, method 400 may be used for fabricating and/or manufacturing, or causing to be fabricated and/or manufactured, an integrated circuit (IC) that implements various time-multiplex sensing schemes and techniques as described herein that are related to providing a weight-shifted array with time-multiplex sensing and/or various associated devices, components and circuits.

At block 410, method 400 may provide an array of bitcells in a number of columns and a number of rows. In some instances, the array of bitcells may refer to a weight-shifted bitcell array that provides for an increase in magnitude of a subsequent row when shifting to a subsequent column, and also, weight of the subsequent row may increase when shifting to the subsequent column. At block 420, method 400 may couple bitlines to the columns of the bitcells, and at block 430, method 400 may couple wordlines to the rows of the bitcells. In some instances, the columns may include an initial column, a last column and one or more additional columns disposed between the initial column and the last column, and the rows may include an initial row, a last row and one or more additional rows disposed between the initial row and the last row.

At block 440, method 400 may arrange the bitcells in groups along corresponding wordlines in each row. In some implementations, each group of bitcells may include multiple sequential bitcells in each row. The multiple sequential bitcells may include a multiple of two sequential bitcells including at least one of 2, 4, 8, 16, 32, 64, 128, 256, 512, and 1024. Also, at block 450, method 400 may shift each group of the bitcells in each row by at least one column with respect to another group of bitcells in a previous row.

In some implementations, method 400 may also include providing a digital sense amplifier that is coupled to the bitcells in the bitcell array via the bitlines, and the digital sense amplifier may use time-multiplex sensing to reduce dynamic power consumption of the bitcell array. Also, the time-multiplex sensing may refer to sensing a summation of values of bitcells along a column at different time intervals.

In some implementations, the digital sense amplifier may be configured to perform binary multiplication by performing one or more of the following operations. For instance, the digital sense amplifier may generate an initial summation result for the initial column by generating a multiplicative product of a wordline signal value of the initial row with a bitcell data value of a corresponding bitcell in the initial column. Also, the digital sense amplifier may generate additional summation results for each column of the one or more additional columns by generating multiplicative products of wordline signal values of the one or more additional rows with corresponding bitcell data values of corresponding bitcells in the one or more additional columns. Also, the digital sense amplifier may generate a last summation result for the last column by generating a multiplicative product of a wordline signal value of the last row with a bitcell data value of a corresponding bitcell in the last column. Further, the wordline signal value of each row may represent a first data bit value of logic 1 or a second data bit value of logic 0, and each bitcell in the bitcell array may be adapted to store a first data bit value of logic 1 or a second data bit value of logic 0.

Described herein are various implementations of an integrated circuit. The integrated circuit may include memory circuitry having a bitcell array with bitcells arranged in columns and rows. The integrated circuit may include bitlines coupled to the columns of the bitcells, and the integrated circuit may include wordlines coupled to the rows of the bitcells. The bitcells may be arranged in multiple groups of bitcells along corresponding wordlines in each row, and each group of bitcells in each row is configured to be shifted by at least one column with respect to another group of bitcells in a previous row.

Described herein are various implementations of an integrated circuit. The integrated circuit may include an array of bitcells arranged in columns and rows, bitlines coupled to the bitcells in the array corresponding to the columns, and wordlines coupled to the bitcells in the array corresponding to the rows. The bitcells may include a single group of first bitcells along an initial wordline in an initial row. The bitcells may include multiple groups of second bitcells along subsequent wordlines in each subsequent row after the initial row. The multiple groups of second bitcells may be configured to be shifted by at least one column with respect to the single group of first bitcells and each group of second bitcells in a previous row.

Described herein are various implementations of a method. The method may include providing an array of bitcells in columns and rows, coupling bitlines to the columns of the bitcells, and coupling wordlines to the rows of the bitcells. The method may include arranging the bitcells in groups along corresponding wordlines in each row, and the method may include shifting each group of the bitcells in each row by at least one column with respect to another group of bitcells in a previous row.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   memory circuitry having a bitcell array with bitcells arranged in columns and rows;
   bitlines coupled to the columns of the bitcells; and
   wordlines coupled to the rows of the bitcells,
   wherein the bitcells are arranged in multiple groups of bitcells along corresponding wordlines in each row, and
   wherein each group of bitcells in each row is configured to be shifted by at least one column with respect to another group of bitcells in a previous row.

2. The integrated circuit of claim 1, wherein the bitcell array refers to a weight-shifted bitcell array that provides for an increase in magnitude of a subsequent row when shifting to a subsequent column, and wherein weight of the subsequent row increases when shifting to the subsequent column.

3. The integrated circuit of claim 1, wherein:
   the columns include an initial column, a last column and one or more additional columns disposed between the initial column and the last column, and
   the rows include an initial row, a last row and one or more additional rows disposed between the initial row and the last row.

4. The integrated circuit of claim 3, further comprising:
   a digital sense amplifier coupled to the bitcells in the bitcell array via the bitlines.

5. The integrated circuit of claim 4, wherein the digital sense amplifier uses time-multiplex sensing to reduce dynamic power consumption of the bitcell array.

6. The integrated circuit of claim 5, wherein the time-multiplex sensing refers to sensing a summation of values of bitcells along a column at different time intervals.

7. The integrated circuit of claim 4, wherein the digital sense amplifier is configured to perform binary multiplication by:
   generating a summation result for the initial column by generating a multiplicative product of a wordline signal value of the initial row with a bitcell data value of a corresponding bitcell in the initial column.

8. The integrated circuit of claim 7, wherein the digital sense amplifier is configured to perform binary multiplication by:
   generating a summation result for each column of the one or more additional columns by generating multiplicative products of wordline signal values of the one or more additional rows with corresponding bitcell data values of corresponding bitcells in the one or more additional columns.

9. The integrated circuit of claim 8, wherein the digital sense amplifier is configured to perform binary multiplication by:
   generating a summation result for the last column by generating a multiplicative product of a wordline signal value of the last row with a bitcell data value of a corresponding bitcell in the last column.

10. The integrated circuit of claim 7, wherein the wordline signal value of each row represents a data bit of logic 1 or logic 0, and wherein each bitcell in the bitcell array is adapted to store another data bit of logic 1 or logic 0.

11. The integrated circuit of claim 1, wherein the bitcell array is a static random access memory (SRAM) bitcell array, and wherein each bitcell is a multiple transistor bitcell.

12. The integrated circuit of claim 11, wherein the multiple transistor bitcell is an eight-transistor (8T) bitcell.

13. An integrated circuit, comprising:
    an array of bitcells arranged in columns and rows;
    bitlines coupled to the bitcells in the array corresponding to the columns; and
    wordlines coupled to the bitcells in the array corresponding to the rows,
    wherein the bitcells include a single group of first bitcells along an initial wordline in an initial row,
    wherein the bitcells include multiple groups of second bitcells along subsequent wordlines in each subsequent row after the initial row, and
    wherein the multiple groups of second bitcells is configured to be shifted by at least one column with respect to the single group of first bitcells and each group of second bitcells in a previous row.

14. The integrated circuit of claim 13, wherein the first bitcells include a six transistor (6T) bitcell along with a two transistor logic circuit.

15. The integrated circuit of claim 13, wherein the second bitcells include a two transistor logic circuit.

16. The integrated circuit of claim 13, wherein:
    the columns include an initial column, a last column and one or more additional columns disposed between the initial column and the last column, and
    the rows include the initial row, a last row and one or more additional rows disposed between the initial row and the last row.

17. The integrated circuit of claim 16, further comprising:
    a digital sense amplifier coupled to the bitcells in the bitcell array via the bitlines,
    wherein the digital sense amplifier uses time-multiplex sensing to reduce dynamic power consumption of the bitcell array, and
    wherein the time-multiplex sensing refers to sensing a summation of values of bitcells along a column at different time intervals.

18. The integrated circuit of claim 17, wherein the digital sense amplifier is configured to perform binary multiplication by:

generating a summation result for the initial column by generating a multiplicative product of a wordline signal value of the initial row with a bitcell data value of a corresponding bitcell in the initial column;

generating a summation result for each column of the one or more additional columns by generating multiplicative products of wordline signal values of the one or more additional rows with corresponding bitcell data values of corresponding bitcells in the one or more additional columns; and generating a summation result for the last column by generating a multiplicative product of a wordline signal value of the last row with a bitcell data value of a corresponding bitcell in the last column.

19. The integrated circuit of claim 18, wherein the wordline signal value of each row represents a data bit of logic 1 or logic 0, and wherein each bitcell in the bitcell array is adapted to store another data bit of logic 1 or logic 0.

20. A method, comprising:

providing an array of bitcells in columns and rows;

coupling bitlines to the columns of the bitcells;

coupling wordlines to the rows of the bitcells;

arranging the bitcells in groups along corresponding wordlines in each row; and shifting each group of the bitcells in each row by at least one column with respect to another group of bitcells in a previous row.

* * * * *